May 21, 1963 N. T. SEATON 3,090,924

IMPROVED HIGH-SENSITIVITY TRIGGER CIRCUITS

Filed Dec. 31, 1956

INVENTOR.
NORMAN T. SEATON

BY Lippincott & Smith

ATTORNEYS

United States Patent Office 3,090,924

Patented May 21, 1963

3,090,924
IMPROVED HIGH-SENSITIVITY TRIGGER CIRCUITS

Norman T. Seaton, Berkeley, Calif., assignor to Beckman Instruments, Inc., Fullerton, Calif., a corporation of California Filed Dec. 31, 1956, Ser. No. 631,773
10 Claims. (Cl. 328—203)

This invention relates to electronic trigger circuits. Its broader principles are applicable to a wide variety of such circuits, including astable, monostable and bistable multivibrators, flip-flops, and amplitude discriminators, both binary and non-binary; while more specific principles of the invention are particularly applicable and useful in connection with binary monostable multivibrators or pulse shapers and analogous amplitude discriminators or quantizers.

Among the objects of this invention are the following: to provide improved simple trigger circuits that have exceptionally high and consistent sensitivities to small and irregular triggering impulses; to provide improved trigger circuits for producing output pulses with exceptionally short rise times; to provide improved trigger circuits for producing output pulses with exceptionally sharp and stable waveforms having durations that are timed with exceptional accuracy; to provide improved simple trigger circuits operable at exceptionally high pulse rates and high duty cycles; and to provide improved high-sensitivity trigger circuits having exceptional immunity to jitter and having exceptional stability in the face of changes in tube characteristics due to aging, tube replacement, filament supply voltage variations, and the like. Other objects and advantages of the invention will appear as the description proceeds.

Briefly stated, in accordance with certain aspects of this invention, the improved trigger circuits have regenerative or positive feedback circuit loops containing a linear amplifier and a nonlinear network such that the loop gain has a value less than one in a plurality of operating states and has a value greater than one in a transition region between such states. This arrangement differs from that of conventional trigger circuits in that the amplifier of the improved circuit has a substantially uniform gain throughout the operating range of the circuit, which is not true in trigger circuits heretofore commonly used. The unusual, unobvious and significant advantages and characteristics that are obtained with the new circuits can best be appreciated from a consideration of the illustrative embodiments hereinafter described.

In accordance with more specific aspects of the invention, the improved trigger circuit includes two vacuum tube stages and two feedback loops. A positive feedback or regenerative loop includes one of the stages operating as a linear amplifier and the other of the stages operating, with respect to this loop, as a cathode follower. The two stages are direct-coupled through a common cathode resistor for stabilizing the sum of the respective cathode currents conducted by the two stages. One of the two stages, preferably the stage that operates as a cathode follower in the positive feedback loop, operates as an amplifier in a direct-coupled negative feedback loop for stabilizing the quiescent steady-state current conducted by that stage. Thus the quiescent steady-state currents of both stages are individually stabilized (one directly and the other by stabilization of the sum) and the overall operating stability of the circuit is greatly increased, as is hereinafter more fully explained.

In any trigger circuit, nonlinearities are required such that the regenerative loop gain has a value less than one at a plurality of operating states and has a value greater than one through a transition region between such states.

For a clean break and a fast transition between states when the circuit is triggered, the nonlinearities preferably are sharp, substantially step-like conductance changes. A binary trigger circuit generally requires two such step-like-nonlinearities.

In the improved trigger circuits, the amplifier stage of the regenerative loop is linear throughout the operating range of the circuit, and therefore both nonlinearities must be provided elsewhere in the circuit. In certain species of this invention, one of the nonlinearities is provided in the cathode follower stage of the regenerative loop. In other species, the cathode follower stage also is linear throughout the operating range of the circuit. The remaining circuit nonlinearity or nonlinearities is provided by one or more asymmetrical resistance devices, preferably crystal diode rectifiers, connected in feedback circuits as hereinafter explained.

The invention will be better understood from the following detailed description taken in connection with the accompanying drawing, and its scope will be pointed out in the appended claims. In the drawing:

Figure 1:
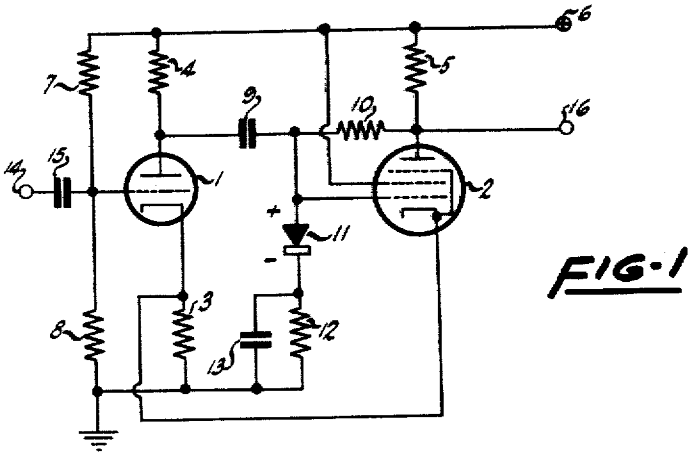
FIG. 1 is a circuit diagram of a monostable multivibrator embodying principles of this invention.

Any multivibrator or other trigger circuit must contain nonlinear circuit elements. Conventional multivibrators usually consist of two vacuum tube amplifier stages regeneratively connected by linear circuit elements (resistance-capacitance networks) so that the conduction of current is switched alternately from one vacuum tube stage to the other. In each of the two stable or quasi-stable operation states of the circuit, the current through one or the other of the two vacuum tube stages is substantially cut off, thereby providing a nonlinearity in each stage that reduces the loop gain to a value less than one in each of the two operating states. Both of the vacuum tube stages are substantially conductive, providing a loop gain greater than one, only during transitions from one operating state to the other.

By using various coupling and biasing circuits many different types of multivibrators can be constructed. Some are astable or free-running, and in this case the circuit triggers itself repetitively from one quasi-stable state to another quasi-stable state. Others are monostable, and require a triggering impulse to initiate a transition from a stable state to a quasi-stable state, while the return transition to the stable state occurs automatically after a predetermined time interval. Still other multivibrators are bistable, having two stable states and require a triggering impulse for transition from either state to the other.

In all of these different types of conventional multivibrators, the nonlinearities essential to their operation occur in the vacuum tube amplifier stages. Sometimes nonlinear circuit elements, such as diode rectifiers, are employed in the coupling or triggering circuits, but the usual purposes of such diodes relate to such matters as pulse-steering and waveform correction without affecting the basic mode of operation in which the essential nonlinearities occur in the amplifier stages.

An analogous situation prevails with respect to many trigger circuits other than conventional multivibrators. Blocking oscillators, for example, are monostable trigger circuits including nonlinear amplifiers. Some trigger circuits have more than two stable or quasi-stable states, as is the case in nonbinary scalers or pulse-counting rings. Amplitude discriminators and quantizers provide still other examples of trigger circuits which, in their common or conventional form, have their essential circuit nonlinearities in one or more of their amplifier stages.

The conventional arrangement using nonlinear amplifiers in trigger circuits results in definite limitations upon circuit performance. Consider a conventional multivibrator, for example. In each stable or quasi-stable state of the circuit, one of the two vacuum tube amplifier stages is completely or substantially cut off, and it is this fact that makes possible the existence of a stable or quasi-stable state by reducing the regenerative loop gain to a value smaller than one. To produce a transition from one state to the other, the loop gain must be increased to a value substantially greater than one.

For a fast transition, necessary to produce an output pulse having a short rise time, the regenerative loop gain throughout the transition region must be much greater than one, because substantial gain in excess of one is needed to charge rapidly the shunt capacitances and to change quickly the currents through the series inductances that are inevitably present in every circuit.

Consequently, upon application of a triggering impulse to a multivibrator, whether the impulse is externally generated, to produce a fast transition and a correspondingly short rise time in the output pulse, the loop gain must change in a short time from a value smaller than one to a value much larger than one. In the case of a conventional multivibrator, this means applying a fairly large triggering pulse with a fast rise time to switch the nonconductive vacuum tube stage from a zero or very low gain to substantially maximum gain in a very short time. By a very short time, we are referring to time intervals in the order of a few millimicroseconds. Small triggering pulses, and triggering pulses with relatively long rise times, are apt to cause unsatisfactory operation of the multivibrator.

The deficiencies of conventional trigger circuits now begin to become apparent. The characteristics of amplifier vacuum tubes near cut-off are, compared for example to those of diodes, only weakly nonlinear, whereas the ideal characteristic is a step function. Because of the weak nonlinearity, considerable change of grid-to-cathode voltage of the vacuum tube is required to reach a transconductance value sufficient for high gain. As a result the transition starts slowly unless the triggering pulse is so large that the system is driven through the nonlinear region by the triggering pulse rather than solely by regeneration. The lack of uniformity from tube to tube, and variations from time to time in the same tube, of the near-cutoff characteristics of vacuum tubes makes it necessary for purposes of overall circuit stability that the nonconductive tube be biased substantially below the point that would give unit loop gain. And since a transition is not initiated until the loop gain becomes greater than one, the amplitude and duration of the triggering pulses must be relatively large for reliable triggering of the circuit.

In the case of an amplitude discriminator or quantizer, the problem is even more serious because of the fact that the amplitude level at which the circuit is triggered can vary from time to time. When conventional trigger circuits are biased for high sensitivity to small triggering impulses, each circuit must be individually adjusted with considerable care, and frequent readjustments are required because of changes in vacuum tube characteristics due to tube replacement, aging of the tubes, or even changes in temperature or filament voltage. Furthermore, in many conventional trigger circuits, either the pulse rate or the duty cycle, or both, may be seriously limited by long time requirements for a complete restoration of capacitor charges, pulse waveforms may lack sharpness and be variable, and pulse durations may not be timed with precise accuracy, because of change in vacuum tube characterisitcs, variations in the voltage swing across the timing capacitors, and other causes.

The improved trigger circuits according to the present invention use linear amplifiers. That is, the amplifiers are operated class A, always substantially above cutoff and below saturation, so that a plot of the amplifier output signal versus its input signal forms a substantially straight line. In other words, the gain of the amplifier is substantially constant throughout the operating range of the circuit. By this means the uncertain, nonlinear and variable characteristics of vacuum tube amplifiers operating near the cutoff is completely avoided. The amplifier always operates near maximum gain, and the circuits are consistently responsive to triggering impulses of small duration and short amplitude.

Stable or quasi-stable states in which the loop gain is less than one are achieved by means of nonlinear circuit elements in the feedback and coupling networks, so arranged that a circuit network external to the amplifier has a low transfer impedance in the stable and quasi-stable states of the circuit, and has a much higher transfer impedance during the brief transition intervals.

Preferably, the nonlinear circuit elements are crystal diodes or rectifiers having a low impedance to substantial current flowing in a forward direction and a much higher impedance to current flowing in a backward direction, so that small changes in current can produce large changes in impedance to produce a substantially step-like impedance function. These impedance changes in crystal diodes are considerably more constant and more accurately predictable than the cutoff characteristics of amplifier vacuum tubes. As a result, the speed of response, triggering sensitivity, stability against aging and change of tubes, reduction of jitter, and reduction of restoring time for the improved trigger circuits may all be improved by a factor of ten or more over the values obtainable with conventional trigger circuits of good design.

Even in the linear portion of its characteristic, the transconductance of a vacuum tube operating with fixed electrode voltages can vary considerably from time to time and from tube to tube. The amplifier gain, and therefore the loop gain, of the regenerative loop in the trigger circuit varies with the transconductance of the vacuum tube. In accordance with a further principle of the present invention the quiescent steady-state currents rather than the electrode voltages of the vacuum tubes are stabilized, and it has been found that by this means the variations in vacuum tube transconductance can be substantially reduced. This in turn leads to greater overall stability of trigger circuits, and thus make possible the design of circuits having higher triggering sensitivity, greater speed of response, and other improved characteristics.

In preferred embodiments of this invention, a trigger circuit consists of two vacuum tube stages having their cathodes connected together and returned to ground or its circuit equivalent through a common cathode resistor. The anode of the first stage is coupled to the control grid of the second, thereby forming a regenerative or positive feedback loop in which the first stage operates as an amplifier while the second stage operates as a cathode follower.

The control grid of one of the stages, preferably the first, is biased to a fixed potential; and by this means, together with the common cathode resistor, the sum of the cathode current conducted by the two stages is stabilized at a substantially constant value.

A direct-coupled negative feedback loop is provided in one of the stages, preferably the second, for stabilizing the quiescent steady-state current conducted by one stage. Since the total current conducted by both stages jointly is stabilized, and the current conducted by one stage alone is also stabilized, it is apparent that the current conducted by each stage is individually stabilized.

If the currents were always stabilized at the same constant values, the circuit would have only one operating state and would not be a trigger circuit. Consequently, to make a trigger circuit some means must be provided for changing the amount of current conducted by at least one of the stages. In the preferred embodiments of this invention, such a change is effected by one or more nonlinear circuit elements, preferably crystal diodes, connected in one of the feedback circuits.

Preferably one or more crystal diodes are connected in a negative feedback circuit of the cathode follower stage. A small change in current through these diodes can produce a large change in their impedance valves, which in turn will change the feedback ratio and provide a substantial change in the amount of current conducted by the cathode follower. The total current conduced by he two stages remains substantially constant at a value determined by the fixed bias potential of the amplifier stage and the value of the cathode resistor that is common to both stages. Consequently, when the current through the cathode follower stage decreases, the current through the amplifier stage increases, and vice versa.

Thus the current through both stages changes by a substantial amount when the trigger circuit shifts from one operating state to another. However, it is important to note that the current changes in the amplifier stage are not sufficient to cause substantial departures from a linear amplifier characteristic. In other words, the amplifier stage is never substantially cut off nor substantially saturated. It operates as a class A amplifier, and has a substantially constant gain throughout the entire operating range of the circuit.

The illustrative embodiments that will now be described are preferred forms of the invention, and serve to illustrate the inventive principles. It should be understood, however, that the broader inventive principles herein disclosed may be applied to a wide variety of trigger circuits, and that countless variations and modifications of such circuits will be apparent to those skilled in the art.

Reference is now made to FIG. 1 of the drawing, which is a simplified circuit diagram of a monostable multivibrator embodying principles of this invention. Such multivibrators have many uses, which are well known to those skilled in the art. They are one branch of the large family called trigger circuits.

A first vacuum tube stage includes an electron discharge device 1 or triode having an anode, a control grid and a cathode; and a second vacuum tube stage includes an electron discharge device 2 or pentode having an anode, a suppressor grid, a screen grid, a control grid, and a cathode. Electron discharge devices 1 and 2 may be separate triode and pentode vacuum tubes, respectively, or they may advantageously be triode and pentode sections of a dual tube within a single vacuum envelope. Two triodes could be used, but better performance can be obtained when tube 2 is a pentode. Two pentodes could be used, but the triode-pentode combination permits the use of more available dual tubes. The two cathodes are connected together and are returned to ground or its circuit equivalent through a common cathode resistor 3. In actual practice, "ground" may be a circuit connection that is maintained at any convenient reference potential, not necessarily zero, and the term "ground" as herein used should be so understood. The two anodes are connected through load resistors 4 and 5, respectively, to a positive anode voltage supply terminal 6. That is, terminal 6 is maintained at a positive potential relative to "ground" by any suitable voltage supply, not shown.

The pentode screen grid is connected to terminal 6, and the suppressor grid is internally (or otherwise) connected to the cathode of the pentode. The control grid of the triode is biased to a fixed potential by means of a voltage divider consisting of resistors 7 and 8 connected between terminal 6 and ground, as shown. The control grid of the pentode is coupled to the anode of the triode through a coupling capacitor 9.

It is evident that a transient increase in the current through triode 1 will produce a transient voltage drop at the anode of triode 1 which will be transmitted through capacitor 9 to the control grid of pentode 2, that the voltage drop at the control grid of pentode 2 will decrease the current through pentode 2 and thus decrease the current through cathode resistor 3, that the decrease in current through cathode resistor 3 will decrease the potential of both cathodes, and that the decrease in the potential of the cathodes will tend to further increase the current conducted by the triode.

Thus there is formed a regenerative or positive feedback loop, and whether or not the circuit will be stable at certain current values depends upon whether or not the regenerative loop gain is greater or less than one. This in turn chiefly depends upon the transfer impedance of the network between the anode of the triode and the control grid of the pentode and upon the values of the two vacuum tube transconductances. The value of cathode resistor 3 is not critical, provided only that its resistance is large compared to a reciprocal of the vacuum tube transconductances. However, the value of resistor 3 does affect the total amount of current conducted by the vacuum tubes, as is hereinafter more fully explained, and its value is chosen with this in view.

In addition to the regenerative or positive feedback loop, there is a negative feedback loop connected to pentode 2 and consisting of a resistor 10 between the anode and the control grid of the pentode, a crystal rectifier 11 and a resistor 12 connected in series between the control grid of the pentode and ground, and a capacitor 13 in parallel with resistor 12. Diode 11 is so poled that its forward or low-resistance direction is the direction of current flowing through the diode away from the pentode control grid.

Capacitor 13 is much larger than capacitor 9, and the time constant of resistor 12 and capacitor 13 in combination is much larger than the time constant of capacitor 9 and resistor 10 in combination. In other words, capacitor 13 is a low-impedance A.C. bypass around resistor 12, so that insofar as transient signals are concerned, crystal diode 11 is effectively connected between the control grid of the pentode and a constant potential that is equivalent to an A.C. ground. However, the direct current through resistor 12 provides a bias potential for pentode 2. Under steady-state conditions, capacitor 13 becomes charged to a voltage equal to the D.C. voltage drop across resistor 12, and capacitor 9 becomes charged to a voltage equal to the potential difference between the anode of the triode and the control grid of the pentode.

The circuit is completed by connections for introducing triggering signals and withdrawing output signals. The triggering signals or impulses preferably are introduced as positive electric pulses supplied to the control grid of triode 1, and for this purpose the control grid of triode 1 is connected to an input terminal 14 through a coupling capacitor 15. The output signal is preferably obtained at the anode of pentode 2, and for this purpose the anode of pentode 2 is connected to an output terminal 16. With this arrangement the output circuit does not load the input or triggering circuit, and has no material effect upon the triggering sensitivity and speed of response of the trigger circuit.

The circuit shown in FIG. 1 is a monostable multivibrator having a stable or quiescent state and a quasi-stable state. When the circuit is in its stable state, triode 1 and pentode 2 both conduct substantial current and both of the vacuum tube stages transmit with substantially their maximum gains any A.C. or transient electric signals supplied to their control grids. However, in the stable state the regenerative loop gain is maintained at a value less than one by a low transfer impedance between the two vacuum tube stages, as is hereinafter more fully explained.

Since the control grid of triode 1 is maintained at a substantially constant potential by the voltage divider consisting of resistors 7 and 8, the sum of the cathode currents conducted by triode 1 and pentode 2 is stabilized by the voltage drop across their common cathode resistor 3. This is so because any increase in the total current increases the positive potential of the cathodes, and this in turn decreases the current through triode 1 and thus decreases the total current. Consequently, the total steady-state current of the two vacuum tube stages is accurately regulated and stabilized by the circuit resistances, and is but little affected by commonly encountered changes in the vacuum tube characteristics.

In the stable or quiescent state of the circuit, crystal diode 11 conducts current in its forward or low-resistance direction. The forward resistance of the crystal diode is small compared to the resistances of resistors 10 and 12 so that while it is conducting in the forward direction the crystal diode acts much like a short circuit since the voltage drop across the diode is small. The cathode potential of pentode 2 is maintained at a substantially constant value by triode 1 as hereinbefore explained. Resistors 10 and 12 form a voltage divider for maintaining the control grid potential at some fixed fraction of the anode potential of pentode 2. If there is an increase in the conduction of current by pentode 2, there is an increase in the voltage drop across resistor 5 which lowers the anode and control grid potentials of the pentode and thus tends to reduce the current. Conversely, if the current conducted by the pentode decreases, the anode and control grid potentials are raised to increase the current. In other words, resistors 10 and 12 and crystal diode 11 form a direct-coupled negative feedback circuit that accurately regulates and stabilizes the quiescent steady-state current conducted by pentode 2 and prevents slow drifts in the amount of current that would otherwise result from such causes as filament emission changes.

Since the sum of the currents conducted by triode 1 and pentode 2 is regulated and stabilized, and the current conducted by pentode 2 alone is regulated and stabilized, it is apparent that the current conducted by triode 1 alone is likewise regulated and stabilized. The steady-state current values are determined almost entirely by the circuit resistances, and variations in the tube characteristics have but little effect upon the steady-state currents. Furthermore, when vacuum tubes are operating in this manner, with stabilized currents rather than with fixed electrode voltages, the vacuum tube transconductance values are much more constant and uniform from time to time and from tube to tube. Because the regenerative loop gain is a function of the vacuum tube transconductances as well as the transfer impedance of the coupling circuit, the stabilization of the transconductance values by means of current stabilization in the manner herein explained provides greater circuit stability and makes possible higher triggering sensitivity and faster response speeds than would otherwise be possible.

While crystal diode 11 is conducting current in its forward or low-resistance direction, the A.C. or transient impedance between the control grid of pentode 2 and ground is very low, since it consists essentially of the low forward resistance of diode 11 in series with the low A.C. impedance of capacitor 13. As a result the transfer impedance between the anode of triode 1 and the control grid of pentode 2 is sufficiently low that the regenerative loop gain is less than one despite the fact that both vacuum tube stages are operating at near maximum gain.

For example, assume a small transient change in the anode current of triode 1, which may be caused either by a noise signal received at input terminal 14, or by noise generated within the trigger circuit itself, or by any other cause. Since capacitors 9 and 13 present a low impedance to A.C. and transient currents, the transient current flows to ground chiefly through the low impedance path consisting of capacitors 9 and 13 in series with the low forward resistance of crystal diode 11. Because the transient current flows to ground through a low-impedance path, it causes little change in potential either at the control grid of pentode 2 or elsewhere in the circuit. Consequently, the small transient change in the anode current of triode 1 produces an even smaller transient change in the cathode current of pentode 2, which is fed back to triode 1 through the common cathode resistance. Since the regenerative loop gain of the circuit is less than one, any transient disturbance progressively decrease in amplitude as they circulate repetitively through the regenerative feedback loop. In other words, the circuit meets the traditional requirements for stable operation.

The circuit will remain in stable state as long as the regenerative loop gain remains less than one, which will be true so long as a net current flows through diode rectifier 11 in the forward or low-resistance direction that exceeds some small critical value. In other words, the circuit is stable with respect to any transient current disturbances having an amplitude smaller than the direct current flowing through the negative feedback network comprising resistors 10 and 12 in series with crystal diode 11. Consequently, various values of circuit stability and triggering sensitivity can be designed into the circuit by appropriate choice of circuit parameters, and in particular by appropriate choice of relative resistance values for the several resistors.

The circuit is triggered from its stable state to its quasi-stable state by the application to input terminal 14 of positive triggering pulses of somewhat greater amplitude than the noise signals hereinbefore discussed. The triggering pulse momentarily drives the control grid of triode 1 in a positive direction and produces a transient increase in the current conducted by the triode. This transient current flows initially through the low-impedance circuit including crystal diode 11, as hereinbefore explained, but its amplitude is greater than and its direction is opposed to the direct current flowing in the negative feedback circuit. Consequently, the next current through crystal diode 11 reverses direction and is now in the backward or high-resistance direction of the diode.

As a result the resistance of the diode suddenly changes from a low value to a high value, and a large voltage drop rapidly appears across the diode with a polarity such that the control grid potential of pentode 2 changes in the negative-going direction. In other words, the transfer impedance of the coupling circuit has suddenly changed from a low value to a high value, and this change increases the regenerative loop gain to a value that is much larger than one. The diode now acts much like an open circuit since a large voltage is present with little current through the diode.

As the control grid of pentode 2 becomes more negative, the amount of current conducted by the pentode decreases and this tends to reduce the potential of both cathodes. The drop in cathode potential further increases the current conducted by triode 1, which increase is transmitted through the now high transfer impedance of the coupling network to drive the control grid potential of pentode 2 still further in the negative direction. Since the regenerative loop gain is now greater than one, the amplitude of the transient progressively increases as it circulates repetitively around the regenerative feedback loop, and the current through triode 1 increases rapidly while the current through pentode 2 decreases rapidly until the process is stopped by some circuit nonlinearity that reduces the loop gain to a value less than one.

In the circuit illustrated in FIG. 1, the limiting nonlinearity is cut off of pentode 2. When the current through pentode 2 has been reduced to zero, further negative-going changes in the control grid potential of the pentode can have no considerable effect upon the current, and therefore the regenerative loop gain is substantially zero. Thus the quasi-stable state is reached, in which triode 1 conducts substantially as much current as the total cathode current that was conducted by both stages in the stable state.

It is important to note that the nonlinear or "cutoff" stage is the cathode follower in the regenerative loop. The amplifier stage in the regenerative loop, consisting of triode 1 and its associated circuit elements, always conducts current and always operates within the linear portion of its characteristic, so that the amplifier gain remains substantially constant throughout the operating range of the circuit.

It should also be noted that the currents of both vacuum tube stages are stabilized in the quasi-stable state of the circuit as well as in the stable state but at different values. In the quasi-stable state, pentode 2 is cut off and therefore its current is stabilized at zero. The total current of both stages is still stabilized in the manner hereinbefore explained by the voltage drop across cathode resistor 3 and the control grid potential of triode 1. However, in the quasi-stable state all of the cathode current flows through triode 1, and therefore the current through triode 1 is stabilized at the total cathode current value. The total current remains about the same, but it is differenly divided between the two stages for the different operating states.

The circuit remains in the quasi-stable state so long as capacitor 9 is sufficiently charged to maintain the control grid of pentode 2 below cut off in consequence of the reduced anode potential of triode 1 caused by the increased current conducted by the triode. While pentode 2 is cut off, current flows from positive supply terminal 6 through resistors 5 and 10 in series to reduce the charge of capacitor 9 and gradually make the control grid potential of pentode 2 more positive. Because the time constant of resistor 12 and capacitor 13 is much larger than the time constant of resistor 10 and capacitor 9, the voltage across capacitor 13 remains substantially constant and a reverse voltage is thereby maintained across diode 11 while capacitor 9 is discharging. Consequently, the transfer impedance of the coupling circuit is still high when capacitor 9 has discharged sufficiently that the control grid potential of pentode 2 rises above cut-off and pentode 2 begins to conduct current again.

As the current through pentode 2 increases, current through triode 1 has to decrease, and the transient decrease in the anode current of triode 1 is transmitted through the high transfer impedance of the coupling circuit to drive the control grid potential of pentode 2 rapidly in the positive-going direction. Because the regenerative loop gain is greater than one, the amplitude of the transient increases progressively as it circulates repetitively through the positive feedback loop, and a quick transition of the circuit from the quasi-stable state towards the stable state results.

As stable-state conditions are approached, the voltage across crystal diode 11 changes polarity and consequently the direction of net current flow through the diode suddenly changes from the high-resistance backward direction to the low-resistance forward direction. As soon as substantial current begins to flow through the diode in the forward direction, the transfer impedance of the coupling network drops to a low value and the loop gain of the regenerative circuit becomes smaller than one. The restoration of charge on condenser 9 to its initial stable state value proceeds with a time constant that depends on the value of capacitor 9 and a resistance somewhat less than that of resistor 4. Since the time constant determining the quasi-stable state involves the much larger value of resistance 10, the restoring time can be made relative short. Furthermore, if parameters are chosen such that the timing current through resistance 10 has substantially the same value in both the stable and astable states, the charge lost by condenser 9 in the astable state is the same as that lost by 13, and the restoration of the former also restores the latter. Consequently, the circuit can operate at high speeds and with high duty cycles, since it is in condition for triggering and has high sensitivity to another triggering impulse almost immediately after a transistion from the quasi-stable state. This is true, not for just one operating cycle or a few successive cycles, but for any number of successive operating cycles.

The improved trigger circuit not only is capable of high triggering sensitivity, but it also has a consistent triggering sensitivity. To trigger the circuit, the transient currents must substantially reverse the direction of net current flow through crystal diode 11, and therefore must exceed in amplitude a critical value approximately equal to the direct current flowing in the negative feedback circuit. However, the amount of direct current so flowing is regulated by the circuit resistances at a substantially fixed value. Furthermore, the diode impedance-versus-current characteristic is substantially constant in shape and exhibits a steep step-like change near the point of current reversal. As a result of all these factors, the triggering sensitivity of the circuit is exceptionally stable.

Output pulses may be obtained at the terminal 16 connected to the anode of the pentode. While the circuit is in its stable or quiescent state, the potential at terminal 16 is less than the potential of terminal 6 by an amount equal to the voltage drop across resistor 5, which is chiefly due to the current flowing through pentode 2 since the current flowing through resistor 10 is relatively small. In the quasi-stable state of the circuit, the potential at terminal 16 is almost equal to the potential at terminal 6, since the pentode is cut off and the current through resistor 10 is still small. (The resistance of resistor 10 is usually much larger than the resistance of resistor 5.) The potential of terminal 16 changes rapidly from one of these values to the other during each transistion of the circuit from one state to the other. Consequently the output pulses are substantially rectangular positive pulses that are much larger and more uniform than the relatively small triggering pulses supplied to input terminal 14. Important considerations for many purposes are a fast rise time and precisely uniform duration in the output pulse. The improved trigger circuit is exceptionally good in both of these respects.

The rise time of the output pulse depends upon the time required for the circuit to make a transition from one of its states to the other. This in turn depends upon how rapidly and by how much the regenerative loop gain becomes greater than one, since the speed of transition is limited to the rate at which the loop gain in excess of one can overcome the tendency of shunt capacitances and series inductances, which are inevitably present in any circuit, to oppose changes in circuit voltages and currents, respectively.

The improved trigger circuits are capable of making very fast transitions. The amplifier stage always operates near maximum gain, while the loop gain is quickly increased at the beginning of each stable-to-quasi-stable state transition from a value less than one to a value much greater than one by the sudden change in diode impedance as the direction of net current flow through the crystal diode reverses.

As a result, the transition time can be shortened by a factor of ten over what is possible in conventional trigger circuits. For example, output pulse rise times in the order of 10 millimicroseconds or less can be achieved without great difficulty.

The duration of the output pulse is substantially the same as the duration of the quasi-stable state, and this depends upon the time required after a transition into the quasi-stable state for the control grid potential of pentode 2 to rise above the cutoff value and initiate a transition back to the stable state. In this connection the important parameters are the magnitude of the voltage swing across timing capacitor 9, the time constant of the timing circuit consisting essentially of resistors 4. 5 and 10 in series with capacitor 9, and the linearity of the capacitance discharge curve. The last-mentioned factor is important because it affects the steepness of the discharge curve at the triggering point where the control grid potenital passes through cutoff. If the slope of the discharge curve is small at this point, any variation in the cutoff potential will produce relatively large variations in the pulse duration.

In the present circuit, a substantially linear discharge curve having a steep slope at the triggering point is achieved by arranging the circuit so that capacitor 9 discharges into a potential source having a high positive value relative to the triggering point. That is to say, capacitor 9, which is charged to a voltage equal to the potential difference between the anode of triode 1 and the control grid of pentode 2, discharges through resistors 4, 5 and 10 toward the potential of positive supply terminal 6. Consequently, the triggering point is passed at a steeply sloping point on the exponential discharge curve. During the quasi-stable state, the resistance of crystal diode 11 is quite high, and consequently the time constant of the timing circuit is almost entirely determined by the relative stable values of resistors 4, 5 and 10 and capacitor 9.

The remaining factor affecting the duration of the quasi-stable state is the magnitude of the voltage swing across the timing capacitor 9. This voltage swing is more accurately regulated in the present circuit than in ordinary trigger circuits, and therefore the duration of the output pulse is timed with greater accuracy. One of the chief factors that affects the magnitude of the voltage swing across capacitor 9 is the amount by which the anode potential of triode 1 changes during a transition from the stable to the quasi-stable state of the circuit.

In the present circuit this factor is precisely regulated and controlled by the current stabilization means hereinbefore described. In the stable state, the total cathode current of the two vacuum tube stages is controlled by the fixed grid bias of tube 1 and the voltage drop across the common cathode resistor 3, while the anode current of tube 2 is controlled by the direct-coupled negative feedback circuit that includes resistors 10 and 12 and the crystal diode 11. As a result the anode current of triode 1 is accurately regulated and controlled, and this current flowing through resistor 4 provides a precisely regulated and controlled potential at the anode of tube 1.

In the quasi-stable state, the total cathode current is controlled in the same manner, but since pentode 2 is cut off, all of the cathode current flows through triode 1 and its anode resistor 4. Consequently, a somewhat lower but precisely regulated and controlled potential is present at the anode of triode 1 during the quasi-stable state. In this manner the voltage swing of the triode anode is precisely regulated and controlled.

The only other factor affecting the voltage swing across capacitor 9 is the difference between the stable-state control grid potential and the cutoff potential of pentode 2. This factor varies by an amount that is kept small by the manner in which the steady-state current of the pentode is regulated, so that the timing accuracy of the circuit for most applications is not seriously affected. Where higher timing accuracy and other advantages are desired, both of the vacuum tube stages may be operated linearly, as is hereinafter discussed in connection with FIG. 3.

Figure 2:
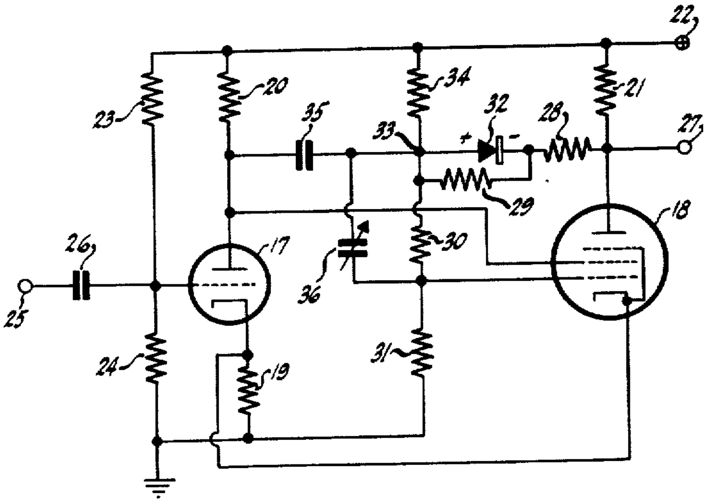
FIG. 2 is a circuit diagram of another monostable multivibrator embodying principles of this invention.

Referring now to FIG. 2 of the drawing, which illustrates another monostable multivibrator, two vacuum tube stages respectively include a triode 17 and a pentode 18, which may be separate tubes or may be sections of a dual tube. The two cathodes are connected together and are returned to ground or its circuit equivalent through a common cathode resistor 19, as shown. The two anodes are connected through resistors 20 and 21, respectively, to a supply terminal 22 that is maintained at a positive potential relative to ground by means of any suitable voltage supply, not shown. A control grid of pentode 18 is coupled to the anode of triode 17 by means of a coupling network (hereinafter described) to form a regenerative or positive feedback loop in which the stage containing triode 17 is an amplifier and the stage containing pentode 18 is a cathode follower. The control grid of triode 17 is biased to a fixed potential by means of a voltage divider consisting of resistors 23 and 24 connected in series between supply terminal 22 and ground. The triode control grid is coupled to an input terminal 25 through a coupling capacitor 26, and the anode of pentode 18 is connected to an output terminal 27.

A direct-coupled negative feedback loop for the cathode follower stage includes three resistors 28, 29 and 30 connected in series as shown between the anode and the control grid of the pentode, and a resistor 31 connected between the control grid of the pentode and ground or its circuit equivalent. A crystal diode or rectifier 32 is connected in parallel with resistor 29 and so poled that its forward or low-resistance direction is the direction of current flowing through the diode toward the anode of the pentode. A circuit junction 33 between crystal diode 32 and resistor 30 in connected to terminal 22 through a resistor 34, is connected to the anode of triode 17 through a coupling capacitor 35, and is connected to the control grid of pentode 18 through a small capacitor 36 having a value of a few micromicrofarads, which may be adjustable. The screen grid of pentode 18 preferably is directly connected to the anode of triode 17. The pentode suppressor grid is internally connected to the cathode.

The circuit illustrated in FIG. 2 is a monostable multivibrator having exceptionally high triggering sensitivity and other desirable characteristics. The vacuum tube currents are stabilized in substantially the same manner as hereinbefore discussed in connection with FIG. 1. The control grid of triode 17 is biased to a fixed value, and the difference between this value and the voltage drop across the common cathode resistor 19 controls the current through triode 17 in such a way that the sum of the cathode currents of triode 17 and pentode 18 is precisely controlled and regulated. In the stable or quiescent state of the circuit, circuit junction 33 is positive with respect to the anode of pentode 18 and current flows in the forward direction through crystal diode 32 so that the crystal diode acts as a low resistance in parallel with the much larger resistance of resistor 29.

In effect, diode 32 and resistors 28, 30, 31 and 34 form a direct-coupled negative feedback network that stabilizes the quiescent steady-state current of pentode 18. If the pentode anode current slowly increases, the voltage drop across resistor 21 increases, the anode potential drops, and there is an increase in the current flowing to the anode through resistor 34, diode 32 and resistor 28. The increased current through resistor 34 lowers the potential of circuit junction 33, which in turn lowers the control grid potential of the pentode and tends to reduce the pentode current. Conversely, a slow decrease in the pentode anode current increases the control grid potential and tends to increase the pentode current. Thus the pentode current is precisely regulated and controlled by the negative feedback circuit. Since the total current through common cathode resistor 19 is precisely regulated, and the anode current of pentode 18 alone is precisely regulated, it is evident that the anode current of triode 17 also is precisely regulated.

As long as the net current flow through diode 32 is in the low-resistance or forward direction, the transfer impedance of the coupling network is low and the regenerative loop gain is less than one. For example, assume that there is a small transient change in the anode current of triode 17. Since the total cathode current is fixed, an opposite transient will appear in the anode and screen of tube 18. That from the anode of tube 18 will flow through the low forward resistance of diode 32, and the resistor 28, and exactly compensate that flowing from the anode junction of tube 17 through the low impedance of condenser 35. Thus the net current flow to the junction 33 will be zero and there will be no change in the potential of this junction unless the transient is of such a sign and magnitude as to reverse the current in diode 32. Or, in other words, any tendency of the control grid potential of pentode 18 to change is immediately opposed by negative feedback, up to the point of current reversal in diode 32.

If resistors 19, 20, 21 and 34 had infinite resistances, and the loading effect of resistors 30 and 31 were negligible, the theoretical minimum regenerative loop gain would be exactly unity irrespective of variations in tube characteristics. Practical circuit parameters give minimum loop gains slightly different from unity. A most significant feature of this circuit is that the circuit parameters can be adjusted to make the minimum loop gain exceptionally close to unity without circuit instability. Consequently, extraordinarily high triggering sensitivity can be obtained. Furthermore, a minimum loop gain close to unity results in restoration of capacitance charges at the end of the quasi-stable state in an almost regenerative fashion, and so in a much shorter time than would otherwise be taken.

As in the FIG. 1 circuit, the triggering sensitivity of the FIG. 2 circuit depends upon the magnitude of the direct current that flows in the forward direction through the crystal diode while the circuit is in the stable state of operation. This is controlled by the values of the various circuit resistors, and can be made to have any reasonable value by appropriate choice of the circuit parameters.

A transition to the quasi-stable state is initiated by supplying to input terminal 25 a positive triggering pulse. This produces a transient increase in the anode current of triode 17 which momentarily reverses the direction of the net current flow through crystal diode 32. As this happens there is a sudden change in the diode impedance from the low forward-resistance value to the much higher backward-resistance value. This prevents the current cancellation effect from anode to anode as hereinbefore described, and so permits a substantial change in the pentode control grid potential responsive to the transient signal transmitted to the control grid through capacitors 35 and 36 in series. In other words, when the direction of net current flow through diode 32 reverses, there is a sudden increase in the transfer impedance of the coupling network and a change in the feedback ratio of the negative feedback network connecting the anode and the control grid of pentode 18.

When the transfer impedance increases, the regenerative loop gain increases directly in proportion and becomes substantially greater than one. Now a transient increase in the anode current of triode 17 lowers the control grid potential of the pentode and thus decreases the cathode current of pentode 18, which lowers the cathode potential and further increases the anode current of triode 17. The progressively increasing transient results in a fast transition to a quasi-stable state wherein pentode 18 is cut off and the total cathode current is conducted by triode 17.

In the quasi-stable state the regenerative loop gain is less than one because of the fact that pentode 18 is cut off and there is substantially no signal transmission from the pentode control grid to the common cathode circuit. The pentode control grid potential is held below cut off for awhile by the decrease in triode anode potential caused by the increase in current through triode 17 and its plate resistor 20, and by the charge (or lack of charge, depending on the initial relation of the potentials at junction 33 and the anode of triode 17) on coupling capacitor 35. The coupling capacitor gradually discharges (or charges) through the circuit comprising resistor 34 in parallel with resistors 21, 28 and 29 in series. The time constant of resistor 30 and capacitor 36 is relatively short and has little effect upon the duration of the quasi-stable state. The chief purpose of capacitor 36 is to make voltage divider 30—31 independent of frequency, so that the grid of the pentode always maintains a fixed fraction of the signal on the triode plate. Its value also determines whether the charge on capacitor 35 is under-restored or over-restored at the end of the quasi-stable state.

As soon as capacitor 35 has discharged (or charged) sufficiently for the pentode control grid to acquire a potential above cutoff, pentode 18 becomes conductive again and a transition from the quasi-stable state toward the stable state is initiated. Diode 32 continues to present a high impedance so long as circuit junction 33 is negative with respect to the anode potential of pentode 18. Consequently the transfer impedance between the anode of triode 17 and the control grid of pentode 18 remains high and a regenerative loop gain much greater than one is maintained during the return transition. After junction 33 becomes positive with respect to the pentode anode, diode 32 begins to conduct current in its forward or low-resistance direction, the regenerative loop gain falls to its normal value of slightly less than one, and the circuit almost regeneratively restores the charge on capacitor 35 through the low forward resistance of diode 32. Since the restoration of charge on the timing capacitor 35 takes place almost regeneratively, the restoration time is very short, enabling the circuit to be operated at high speed and at a high duty cycle.

For achieving the highest possible triggering sensitivity, the circuit parameters are so chosen that the regenerative loop gain is just less than one when the circuit is in the stable state, and the net flow of direct current through diode 32 has a small magnitude in the forward direction. The latter consideration generally requires a rather high value for resistor 34. To permit shorter time constants for short-duration output pulses, resistor 29 is connected in parallel with diode 32 so that the effective resistance of the timing circuit can be reduced without reducing the value of resistor 34 and lowering the triggering sensitivity. However, the resistance of resistor 29 must be large compared to the forward resistance of diode 32, so that there will be a substantial change in the parallel resistance of diode 32 and resistor 29 approximately when the net current through the diode changes from the forward direction to the backward direction, and vice versa.

Resistor 28, which has a small resistance compared to the backward resistance of diode 32, though generally larger than the forward resistance of the diode, assists in making the waveform of the outward pulse more rectangular than it would otherwise be. Capacitor 36 suppresses any tendency of the circuit to become self-triggering or free-running after it has once been started in operation at a high pulse rate by a train of closely successive triggering pulses. Furthermore, capacitor 36 assists in transmitting transients from the anode of the triode to the control grid of the pentode. It is adjusted experimentally for maximum sensitivity without instability.

Although both of the circuits chosen for illustration in FIGS. 1 and 2 are monostable multivibrators, it should be appreciated that the broader principles of this invention are not limited to monostable trigger circuits. Other types of operation can be obtained with relatively minor circuit changes. In the case of the FIG. 1 circuit, for example, an astable or free-running multivibrator can be made simply by coupling input terminal 14 to output terminal 16 (through a time delay circuit if desired) so that each output pulse supplies the triggering pulse for the next cycle of operation. Other modifications of the circuits shown in FIGS. 1 and 2 will occur to those skilled in the art for constructing various astable, monostable and bistable multivibrators, binary and nonbinary counting rings, amplitude discriminators, and other types of trigger circuits.

Figure 3:
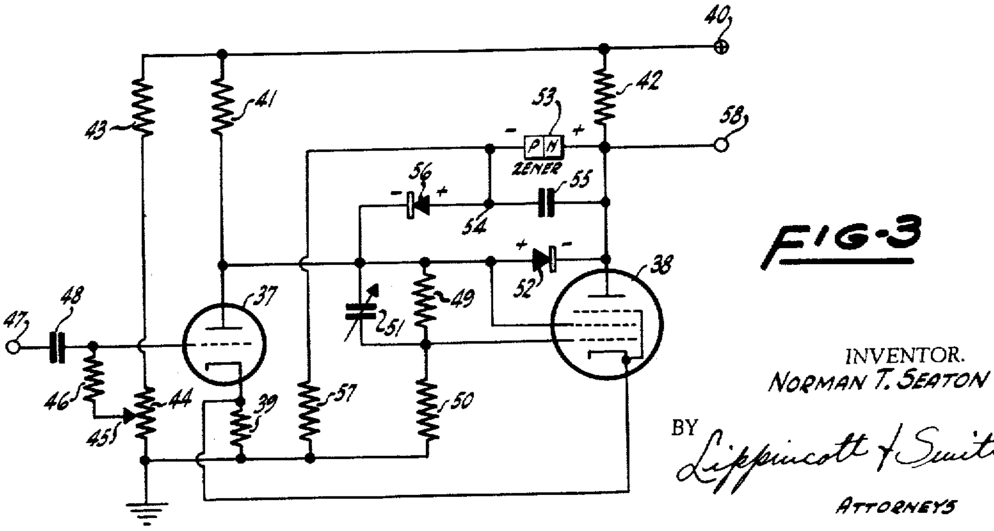
FIG. 3 is a circuit diagram of an amplitude discriminator embodying principles of this invention.

Reference is now made to FIG. 3 of the drawings, which is a simplified circuit diagram of an amplitude discriminator that is triggered by input pulses only if they exceed a certain value in amplitude. A further feature of the embodiment shown in FIG. 3, which is also applicable to multivibrators and other trigger circuits as well as to amplitude discriminators, is the provision of two nonlinear impedances in the coupling network so arranged that the cathode follower stage as well as the amplifier stage of the regenerative loop operates linearly with a substantially constant gain.

A triode 37 and a pentode 38 have their cathodes connected together and returned to ground or its circuit equivalent through a common cathode resistor 39. If desired, the common cathode resistor may be a pentode vacuum tube adjusted to conduct a constant current. The two anodes are connected to positive voltage supply terminal 40 through resistors 41 and 42, respectively. The suppressor grid is internally connected to the cathode of the pentode, and the screen grid is directly connected to the anode of the triode.

A resistor 43 is connected in series with a potentiometer 44 between terminal 40 and ground, as shown, to provide an adjustable bias voltage at the adjustable tap 45 of the potentiometer. The control grid of triode 37 is connected to tap 45 through a grid leak resistor 46 and is connected to an input terminal 47 through a coupling capacitor 48.

A coupling network between the triode and the pentode includes the following: a resistor 49 connected between the triode anode and the pentode control grid; a resistor 50 connected between the pentode control grid and ground or its circuit equivalent; a small bypass capacitor 51, which may have an adjustable capacity of a few micromicrofarads, connected in parallel with resistor 49; a crystal diode 52 connected between the two anodes with its forward or low-resistance polarity in the direction of current flow from the triode anode to the pentode anode; a Zener diode 53 connected between the pentode anode and a circuit junction 54; a capacitor 55 connected in parallel with diode 53; a crystal diode 56 connected between circuit junction 54 and the triode anode with its forward or low-resistance polarity being in the direction of current flow from junction 54 to the triode anode; and a resistor 57 connected between circuit junction 54 and ground or its circuit equivalent. The trigger circuit is completed by an output terminal 58 connected to the anode of pentode 38.

The Zener diode 53 consists essentially of a P-N semiconductor junction operated with sufficient current flowing in the reverse direction across the junction so that the substantially constant Zener voltage of the junction is provided between the two diode terminals. In the circuit illustrated, resistor 57 has a sufficiently low resistance to maintain a substantial flow of current from the pentode anode through diode 53 and resistor 57 to ground and a constant voltage drop (about 15 volts for example) is maintained across the Zener diode 53. In this way circuit junction 54 is kept at a potential that is more negative than that of the pentode anode by a substantially constant amount.

Now assume that the control grid potential of triode 37 is maintained at some constant potential, and that the circuit is operating in a stable state wherein the triode anode is slightly more positive than the pentode anode. Under these conditions current flows through diode 52 in its forward or low-resistance direction, which prevents any large difference between the potentials of the two anodes. Consequently, the respective currents flowing through resistors 41 and 42 are inversely proportional to the resistance values of these resistors.

Since the cathode potentials of triode 37 and pentode 38 are equal, the division of current between the two stages depends upon the relation between the two control-grid potentials and the relation between the two vacuum tube transconductances. In the absence of an input signal supplied to terminal 47, the control grid potential of triode 37 is determined by the position of potentiometer tap 45. The control grid potential of pentode 38 is a fixed fraction of the anode potential that is determined by the relative values of resistors 49 and 50.

Current through resistor 57 draws sufficient current through diode 53 to maintain the Zener voltage drop across the P-N junction. Since circuit junction 54 is substantially negative (about 15 volts for example) with respect to the pentode anode potential, the flow of current through diode 56 is in the reverse direction for this circuit state, and diode 56 has a high resistance at this time.

During the circuit state, when current flows in the forward direction through diode 52, small transients in the anode current of triode 37 merely cause small changes in the amount of current flowing through diode 52, with relatively little change in the control grid potential of pentode 38. In other words, the transfer impedance between the triode anode and the pentode control grid is low, the regenerative loop gain is less than one, and the circuit is stable in this operating state.

Now assume that tap 45 is slowly moved upward for increasing the positive potential of the triode control grid. As this happens, the amount of current conducted by the triode increases, and that in the pentode decreases a like amount, since the total cathode current is effectively constant by virtue of the large positive potentials on each grid. As long as the triode conducts insufficient current to cause the anode of diode 52 to go negative with respect to the pentode plate, the diode acts like a very small resistor, and the total cathode current flows into the parallel resistances of resistors 41 and 42. Since the total cathode current is a constant, the output voltage and that of the pentode grid are also fixed until the current in diode 52 reverses, whereupon a transition from one circuit state to the other takes place. Thus the current through the pentode decreases as the current through the triode increases, and up till the transition point, the chief effect of the change in triode control-grid potential is a change of the current division ratio between the triode and the pentode and, consequently, a change in the current flowing through diode 52.

While the resistances of both diodes 52 and 56 are high, the negative feedback ratio between the anode and the control grid of pentode 38 is low. At this time any change in the anode current of triode 37 causes a substantial change in the control grid potential of pentode 38. In other words, now the transfer impedance between the triode anode and the pentode control grid is high, and as a result the regenerative loop gain suddenly jumps to a value much larger than one. When the loop gain is large, any transients increase in amplitude as they circulate repetitively around the regenerative feedback loop. Accordingly, any small transient increase in the anode current of triode 37 decreases the control grid potential of pentode 38, which decreases the cathode current of pentode 38, which decreases the positive potential of both cathodes, which further increases the anode current of triode 37. Because of this regenerative action, there is a sudden and substantial change in the division of current between the triode and the pentode at the operating point where the change in current through diode 52 causes a sudden jump in the diode resistance from a low value to a higher value.

The transition just described continues until the potential of the pentode anode becomes more positive than the potential of the triode anode by an amount approximately equal to the constant voltage drop across Zener diode 53, whereupon circuit junction 54 becomes more positive than the triode anode and the current flow through diode 56 changes direction. Now the current flow through diode 56 is in the forward or low-resistance direction, and a low-impedance path is provided between the two anodes that prevents the pentode anode from becoming substantially more positive than the potential of the triode anode plus the constant voltage drop across the Zener diode.

Furthermore, the transfer impedance now drops to a low value again, because any small changes in the anode current of triode 37 will, for the most part, merely cause changes in the amount of current flowing through Zener diode 53 and diode rectifier 56, with little change in the control grid potential of pentode 38. Consequently, the regenerative loop gain drops to a value less than one, and the circuit operates in a second stable state.

Now if tap 45 is moved downward for reducing the positive potential of the triode control grid, the transition back to the first stable state will occur as soon as the change of current through diode 56 causes the impedance of the diode to jump to a high value. Thus there is a small range of potentiometer positions wherein a transition from one state to another of the circuit will occur each time that tap 45 is moved through this range in either direction.

The difference between the position at which a transition occurs when tap 45 is being moved upward and the position at which a transition occurs when tap 45 is being moved downward is a measure of the circuit hysteresis, which is required to be small in most cases. With the improved circuit here described, the hysteresis can be made exceptionally small, since both the amplifier stage and the cathode follower stage are substantially linear, have substantially uniform gains, and both conduct substantial amounts of current at all times.

A high regenerative loop gain is provided during substantially all of the transition interval, while two stable states are provided by two nonlinear elements in the coupling circuit. Very rapid and large changes in the regenerative loop gain are made possible by the steep and consistent impedance-versus-current characteristics of crystal diodes near the point of current reversal. It should, of course, be understood that the transition triggering point, sometimes herein referred to somewhat loosely as the point at which the direction of current flow reverses, is actually the point at which the diode impedance equals the critical value, which is near but not necessarily exactly at the precise point of current reversal. The impedance of an ideal crystal or vacuum tube diode varies inversely as the forward current through it.

The circuit illustrated in FIG. 3 may be used in a number of ways. If tap 45 is adjusted to a position very close to a transition triggering potential, small input pulses of the selected polarity supplied to input terminal 47 will cause the transition from one circuit state to the other. Either positive or negative triggering pulses may be utilized, depending upon the position of tap 45 relative to the critical triggering points. When the circuit is triggered from one state to the other, there is a sudden change in the potential of the pentode anode, which change is transmitted to output terminal 58 to provide an output signal.

For use of the circuit as an amplitude discriminator, tap 45 is moved a predetermined distance away from a critical triggering point. There is now a small and substantially constant difference between the bias potential at terminal 45 and the potential needed at the control grid of triode 37 to initiate a transition from one state to another. Input pulses having an amplitude smaller than this potential difference will not trigger the circuit. Pulses of larger amplitude and of the selected polarity will trigger the circuit for producing a transition from one state to another and providing an output signal at terminal 58. Thus the circuit is exceptionally useful as an amplitude discriminator that responds only to pulses exceeding a certain critical amplitude.

With a slight modification the circuit can be used to determine when a direct current or voltage exceeds a certain value, and thus the circuit can be used as a quantizer. If the input signal is a direct current, it is only necessary to short capacitor 48 so that the direct current produces across grid-leak resistor 46 a voltage drop proportional to the value of the current. Whenever the current is smaller than some critical value determined by the resistance of resistor 46 and the position of adjustable tap 45, the circuit remains in one of the two stable states; and when the value of the current exceeds the aforesaid critical value the control grid potential of triode 37 will pass through the triggering potential that initiates a transition to the other stable state of the circuit.

During the transition the potential of output terminal 58 changes from one substantially fixed value to another substantially fixed value, so that the output potential provides a positive and unmistakable indication of whether or not the input current exceeds the predetermined critical value.

If the input signal is a direct voltage, coupling capacitor 48 may be replaced by a resistor so that the control grid potential of triode 37 will be a function of the input voltage. Alternatively, all of the connections to the triode control grid may be eliminated except a direct connection between this control grid and the input voltage source.

Numerous modifications and variations may be made in the embodiments herein described, and the broader principles of this invention are applicable to a countless variety of trigger circuits. Accordingly, it should be understood that this invention in its broader aspects is not limited to the specific embodiments herein illustrated and described, and that the following claims are intended to cover all changes and modifications that do not depart from the true spirit and scope of the invention.

What is claimed is:

1. A trigger circuit comprising a class A linear vacuum tube stage, a vacuum tube cathode follower stage, said stages having a common cathode resistor conducting substantially all of the cathode current from both of said stages, nonlinear coupling means connecting said two stages together in a regenerative circuit loop having a loop gain that varies between a value greater than one and a value smaller than one, means biasing a control grid of one of said stages to a fixed potential for regulating the sum of the currents conducted by said stages, and direct-coupled negative feedback means including a nonlinear asymmetrical resistance element and controlling the control grid potential of the other of said stages for regulating the current conducted by the latter of said stages alone.

2. A trigger circuit comprising first and second electron discharge devices each having an anode and a control grid and a cathode, said cathodes being connected together in series with a common cathode resistor, said anodes being connected to a positive voltage supply terminal through separate anode resistors, coupling means between the anode of said first device and the control grid of said second device forming a regenerative circuit loop in which said first device operates as a linear amplifier while said second device operates as a cathode follower, and a direct-coupled circuit providing negative feedback between the anode and the control grid of said second device that stabilizes the current conducted thereby, said negative feedback circuit including an asymmetrical resistance element that conducts current in its low-resistance direction during said stable state, and connections for receiving triggering pulses to reverse the direction of current flow through said asymmetrical resistance device, whereupon the gain of the regenerative loop becomes greater than one and a transition to another operating state is initiated.

3. A trigger circuit comprising first and second vacuum tube stages having a common cathode resistor conducting substantially all of the cathode current from said first and second vacuum tube stages, means coupling a control grid of said second stage to an anode of said first stage to form a regenerative circuit loop in which said first stage operates as a linear amplifier and said second stage operates as a cathode follower, a resistor connected between an anode of said second stage and said control grid, and a diode connected between said control grid and a substantially constant-potential circuit junction, said diode having substantially different resistance values to substantial net current flow in different directions so the transfer impedance between the anode of said first stage and the control grid of said second stage varies according to the direction of net current flow through said diode, said regenerative circuit loop having a loop gain that is smaller than one when the net current flow through said diode is in the low-resistance direction and is larger than one when said net current flow is in the high-resistance direction.

4. A trigger circuit comprising a triode vacuum tube stage having an anode, a control grid and a cathode, a pentode vacuum tube stage having an anode, a suppressor grid, a screen grid, a control grid, and a cathode, said cathodes being connected together in series with a common cathode resistor, said anodes being connected to a voltage supply terminal through separate anode resistors, said screen grid being connected to said voltage supply terminal and said suppressor grid being connected to the pentode stage cathode, means biasing the control grid of said triode stage to a fixed potential for regulating the total cathode current of said two stages, a coupling capacitor connected between the anode of said triode stage and the control grid of said pentode stage forming a regenerative circuit loop in which said triode stage operates as a linear amplifier while said pentode stage operates as a cathode follower, a resistor connected between the anode and the control grid of said pentode stage, a diode and a resistor connected in series in the order named between the control grid of said pentode stage and a relatively negative constant-potential circuit junction, a by-pass capacitor in parallel with said last-mentioned resistor, said diode having a lower resistance to net current flow away from the pentode stage control grid than to net current flow toward the pentode stage control grid, whereby the transfer impedance between the anode of said triode stage and the control grid of said pentode stage is low and the regenerative loop gain is less than one when the net current flow through said diode is in the low-resistance direction, and connections for applying triggering pulses to the control grid of said triode stage for reversing the direction of current flow through said diode, whereupon the transfer impedance suddenly increases and the regenerative loop gain becomes greater than one.

5. A trigger circuit comprising two vacuum tube stages each having an anode and a control grid and a cathode, said cathodes being connected together in series with a common cathode resistor conducting substantially all of the cathode current from both of said vacuum tube stages, said anodes being connected to a voltage supply terminal through separate anode resistors, means coupling the control grid of said second stage to the anode of said first stage to form a regenerative circuit loop in which said first stage operates as a voltage amplifier while said second stage operates as a cathode follower, a resistor connected between the control grid of said second stage and a constant-potential circuit junction, and a diode connected in a circuit between the control grid and the anode of said second stage, said diode having a lower resistance to current flow in one direction than in the other direction, whereby the transfer impedance between the anode of said first stage and the control grid of said second stage varies with changes in the direction of current flow through said diode and changes the regenerative loop gain between a value less than one and a value greater than one.

6. A trigger circuit comprising first and second electron discharge devices each having an anode and a control grid and a cathode, said cathodes being connected together, a constant-potential circuit junction, a resistor connected between said cathodes and said circuit junction, a supply terminal having a constant potential that is positive with respect to the potential of said junction, two anode resistors connected between said supply terminal and respective ones of said anodes, a resistor connected between said supply terminal and the control grid of said first device, a resistor connected between the control grid of said first device and said junction, a rectifier connected in a circuit between the control grid and the anode of said second device, and means coupling the control grid of said second device to the anode of said first device, said rectifier having an asymmetrical resistance-versus-current characteristic that provides a lower resistance to a net flow of current toward the anode of said second device than to a net flow of substantial current from the anode of said second device.

7. A trigger circuit comprising first and second vacuum tube stages each having an anode and a control grid and a cathode, both of said cathodes being connected in series with a common cathode resistor, said two anodes being connected to a positive voltage supply terminal through separate resistors, a circuit junction coupled to the anode of said first stage, a resistor connected between said positive voltage supply terminal and said circuit junction, a resistor connected between said circuit junction and the control grid of said second stage, a variable capacitor connected in parallel with the last-mentioned resistor, a resistor connected between the control grid of said second stage and a source of constant potential negative with respect to said supply terminal, and a diode that has an asymmetrical resistance-versus-current characteristic connected between said circuit junction and the anode of said second stage.

8. A trigger circuit comprising a triode vacuum tube stage having an anode and a control grid and a cathode, a pentode vacuum tube stage having an anode and a suppressor grid and a screen grid and a control grid and a cathode, said cathodes being connected together in series with a common cathode resistor, a positive voltage supply terminal, two resistors connected between said supply terminal and respective ones of said anodes, said suppressor grid being connected to the cathode of said pentode stage and said screen grid being connected directly to the anode of said triode stage, means biasing the control grid of said triode stage to a substantially constant potential, a circuit junction, a coupling capacitor connected between the anode of said triode stage and said circuit junction, a resistor connected between said positive supply terminal and said circuit junction, a resistor connected between said circuit junction and the control grid of said pentode stage, a capacitor connected in parallel with the last-mentioned resistor, a resistor connected between the control grid of said pentode stage and a source of constant potential that is negative with respect to the potential of said positive supply terminal, a diode and a resistor connected in series in the order named between said circuit junction and the anode of said pentode stage, a resistor connected in parallel with said diode, said diode having a lower resistance to a net flow of current from said circuit junction toward the anode of said pentode stage than it has to a net flow of current from the anode of said pentode stage toward said circuit junction, said triode stage operating as a linear class A amplifier and said pentode stage operating as a cathode follower in a regenerative circuit loop that has a loop gain less than one when the net current flow through said diode is in the low-resistance direction, and means for supplying triggering pulses to the control grid of said triode stage for reversing the direction of net current flow through said diode to increase the regenerative loop gain to a value greater than one.

9. A trigger circuit comprising two vacuum tube stages each having an anode and a control grid and a cathode, said cathodes being connected together in series with a common cathode resistor, said anodes being connected to a positive voltage supply terminal through separate resistors, means coupling the control grid of said second stage to the anode of said first stage, a resistor connected between said control grid of said second stage and a source of constant potential, a first diode connected in a circuit between the control grid and the anode of said second stage, a second diode connected in series with a constant voltage device in said circuit between the control grid and the anode of said second stage, both of said diodes having asymmetrical resistance-versus-current characteristics with the low-resistance direction of one diode being opposite to the low-resistance direction of the other with respect to anode current of said second stage.

10. An amplitude discriminator comprising a triode vacuum tube stage having an anode and a control grid and a cathode, a pentode vacuum tube state having an anode and a suppressor grid and a screen grid and a control grid and a cathode, said suppressor grid being connected to the cathode of said pentode stage, said cathodes being connected together and being connected through a common series cathode resistor to a source of substantially constant potential, a supply terminal positive with respect to said source of constant potential, two resistors connected to said supply terminal and to respective ones of said anodes, said screen grid being connected directly to the anode of said triode stage, means biasing the control grid of said triode stage to an adjustable constant potential, connections for supplying input pulses to the control grid of said triode stage, a Zener diode and a resistor connected in series in the order named between the anode of said pentode stage and said source of constant potential, a capacitor connected in parallel with said Zener diode, a crystal diode rectifier connected in series with said Zener diode between the anode and the screen grid of said pentode stage, a crystal diode rectifier connected between the screen grid and the anode of said pentode stage, said rectifiers having asymmetrical resistance characteristics and being poled so that the first-mentioned diode rectifier has its lowest resistance in the direction of current flow from the anode toward the screen grid while the second-mentioned diode rectifier has its lowest resistance in the direction of current flow from said screen grid toward the anode of the pentode stage, a resistor connected between said screen grid and the control grid of said pentode stage, a capacitor connected in parallel with said last-mentioned resistor, and a resistor connected between the control grid of said pentode stage and said source of constant potential.

References Cited in the file of this patent

UNITED STATES PATENTS

| | | |
|---|---|---|
| 2,562,660 | Chance | July 31, 1951 |
| 2,572,016 | Elbourn | Oct. 23, 1951 |
| 2,651,717 | Uttley et al. | Sept. 8, 1953 |
| 2,654,029 | Buchner | Sept. 29, 1953 |
| 2,683,806 | Moody | July 13, 1954 |
| 2,696,557 | Gray | Dec. 7, 1954 |
| 2,802,107 | Arnold | Aug. 6, 1957 |
| 2,810,072 | Amatniek | Oct. 15, 1957 |
| 2,824,222 | Furlow | Feb. 18, 1958 |
| 2,824,223 | Phelps | Feb. 18, 1958 |
| 2,882,400 | Zeidler | Apr. 14, 1959 |

FOREIGN PATENTS

| | | |
|---|---|---|
| 1,098,225 | France | July 20, 1955 |

OTHER REFERENCES

Hunter: "Handbook of Semiconductor Electronics," McGraw-Hill Book Co., first edition, 1956, pages 11–28 and 15–48 relied on.

UNITED STATES PATENT OFFICE
CERTIFICATE OF CORRECTION

Patent No. 3,090,924 May 21, 1963

Norman T. Seaton

It is hereby certified that error appears in the above numbered patent requiring correction and that the said Letters Patent should read as corrected below.

Column 3, line 22, after "externally" insert -- or internally --; column 5, line 11, for "conduced" read -- conducted --; same line 11, for "he" read -- the --; column 8, line 41, for "next" read -- net --; column 9, line 24, for "differenly" read -- differently --; column 11, line 5, for "potenital" read -- potential --; column 12, line 22, for "in" read -- is --.

Signed and sealed this 10th day of December 1963.

(SEAL)
Attest:

ERNEST W. SWIDER
Attesting Officer

EDWIN L. REYNOLDS
Acting Commissioner of Patents